United States Patent [19]

Schwendtner et al.

[11] Patent Number: 5,177,433
[45] Date of Patent: Jan. 5, 1993

[54] CURRENT-VOLTAGE TRANSFORMER FOR ELECTRONIC HOUSE-SERVICE METER

[75] Inventors: Manfred Schwendtner, Schwarzenbruck; Günter Steinmüller, Nürnberg; Wolfgang Dohmstreich, Lauf, all of Fed. Rep. of Germany

[73] Assignee: Siemens Aktiengesellschaft, Berlin & Munich, Fed. Rep. of Germany

[21] Appl. No.: 643,787

[22] Filed: Jan. 18, 1991

[30] Foreign Application Priority Data

Jan. 23, 1990 [EP] European Pat. Off. ........ 90101335.9

[51] Int. Cl.$^5$ ..................... G01R 33/00; G01R 33/02
[52] U.S. Cl. ................. 324/127; 324/117 R; 336/178
[58] Field of Search ............ 324/127, 117 R, 126, 324/142, 251, 252, 244; 336/200, 173, 175, 208, 20, 178, 216

[56] References Cited

U.S. PATENT DOCUMENTS

| | | | |
|---|---|---|---|
| 1,961,823 | 6/1934 | Garton | 324/127 |
| 2,497,669 | 2/1950 | Haley | 324/127 |
| 2,777,116 | 1/1957 | Gordon | 336/208 |
| 2,870,407 | 1/1959 | Baker | 324/127 |
| 2,920,297 | 1/1960 | Spicer | 336/175 |
| 3,603,864 | 9/1971 | Thaler | 336/178 |
| 3,649,912 | 3/1972 | Nakamura | 324/252 |
| 3,812,428 | 5/1974 | Trenkler | 324/127 |
| 4,706,017 | 11/1987 | Wilson | 336/175 |
| 4,794,360 | 12/1988 | van Mensvoort | 336/178 |
| 4,894,610 | 1/1990 | Friedl | 324/117 R |

FOREIGN PATENT DOCUMENTS 0243630 11/1987 European Pat. Off. .
3619423 10/1987 Fed. Rep. of Germany .
2312844 12/1976 France .

*Primary Examiner*—Vinh Nguyen
*Attorney, Agent, or Firm*—Kenyon & Kenyon

[57] ABSTRACT

The current transformer of an electronic house-service meter has a ferromagnetic core which, except for an air gap, is closed. A measuring coil is inserted in the air gap and is fastened, and dimensioned so that it lies within the cross sectional area of the core.

8 Claims, 2 Drawing Sheets

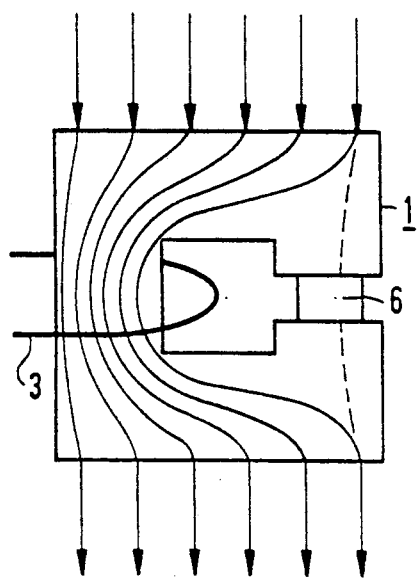
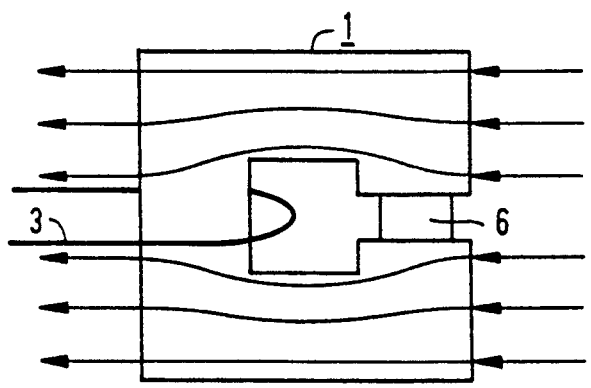
FIG 4
FIG 5
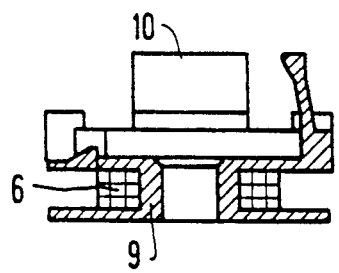
FIG 6
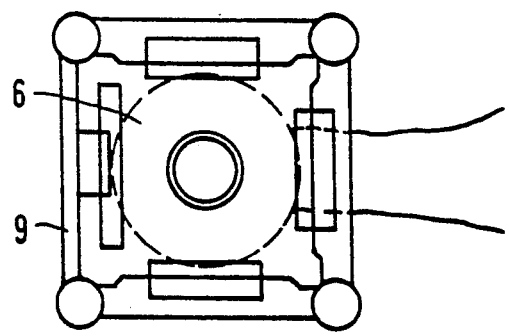
FIG 7

CURRENT-VOLTAGE TRANSFORMER FOR ELECTRONIC HOUSE-SERVICE METER

BACKGROUND OF THE INVENTION

The present invention relates to a current-voltage transformer for electronic house-service meters whose primary winding is magnetically coupled with a measuring coil via a ferromagnetic core and more particularly to such a transformer in which the measuring coil is inserted in an air gap of the transforming fastened and dimensional so that it lies within the cross sectional area of the core.

Electronic house-service meters having a current-voltage transformer require measuring value transducers for determining energy consumption. The transducers, transduce the consumer current into electrical quantities which can be further processed by electronic components. For this purpose it is required to convert consumer currents of, for example, 100 A into measuring currents or measuring voltages in the mA or mV range, respectively. Moreover, in the case of multi-phase current meters, the transformer must ensure a secure isolation. A further requirement is that the meter be insensitive to external magnetic interference fields and be independent of the conversion of a potential dc current premagnetization.

A current transformer configuration for avoiding the influence of external magnetic interference fields on the conversion results is known from DEP 36 19 423. In that configuration the primary conductor is implemented as a folded flat conductor with opposing conduction sections. There are two loop-form recesses which each form a current loop. To each current loop is assigned a measuring coil wound oppositely and provided with 50% of the total available windings. The two measuring coils are disposed between the two flat conductors conducting back and forth. The conductors comprise a magnetic shielding material. In this manner the measuring coils are largely shielded against magnetic interfering fields and the residual effect is compensated through the opposite winding of the two measuring coils.

The problem with this arrangement is that it is relatively expensive and space-consuming. Furthermore, due to the low coupling through the missing core of ferromagnetic material between primary winding and secondary coils, this arrangement supplies only low-level output signals.

SUMMARY OF THE INVENTION

The present invention is based on the task of creating a current-voltage transformer which is compact, supplies a high-level output signal and yet is free of the influence of external magnetic interference fields and in which a dc current premagnetization is effective only within the permissible tolerance limits.

This task is solved through the present invention in which a primary winding of the current voltage transformer is magnetically coupled with a measuring coil via a ferromagnetic core that is closed except for an air gap. The measuring coil is inserted in the air gap with a coil axis in the direction of the field lines. The measuring coil is fastened and dimensioned so that it lies within the cross-sectional area of the core. As a consequence, the external magnetic interference fields are led around the air gap, and consequently the measuring coil, via the core of ferromagnetic material bundled around the air gap. The core thus functions simultaneously as magnetic shielding against the measuring coil. Moreover, through the air gap the dc current premagnetization is kept low and is kept within the permissible range. This applies also for the effective permeability whose temperature dependence is likewise so far reduced by the air gap that it is negligible.

Where a ferrite core is used as the ferromagnetic core, an especially good and reproducible mechanical stability of the air gap is achieved since the magnetic circuit comprises a compact part.

The core may have a sequence cross section and a rectangular shape with a primary yoke girded by the primary winding and a secondary yoke interrupted by the air gap and connected with it via a parallel shank.

The coil may be placed on a coil form of elastic synthetic material having elastic fastening tabs which fix detachably on the coil form disposed in the air gap on the core.

Thus, the coil form of the measuring coil is simultaneously used as a holding element with the advantage that a precise insertion of the measuring coil into the air gap also is possible without significant adjustment effort even in mass production.

BRIEF DESCRIPTION OF THE DRAWINGS

FIGS. 4 and 5 illustrate a fundamental representation of the field line course of external magnetic interference fields upon the transformer of the present invention.

FIGS. 6 and 7 illustrate the measuring coil of the present invention with a holding body.

DETAILED DESCRIPTION

Figure 1:
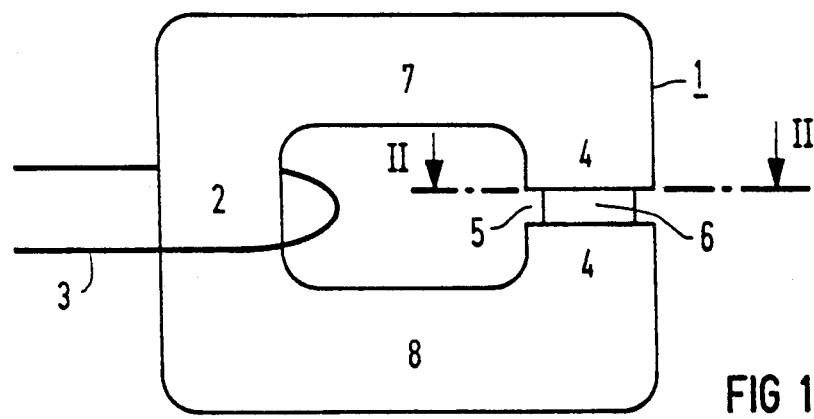
FIG. 1 illustrates a lateral view of a transformer in accordance with an embodiment of the present invention.

The transformer represented in FIG. 1 comprises a U-form core 1 of ceramic ferromagnetic material (ferrite core), whose primary yoke 2 carries the primary winding 3 and whose secondary yoke 4 is interrupted by an air gap 5. A measuring coil 6 is disposed in the air gap.

Figure 2:
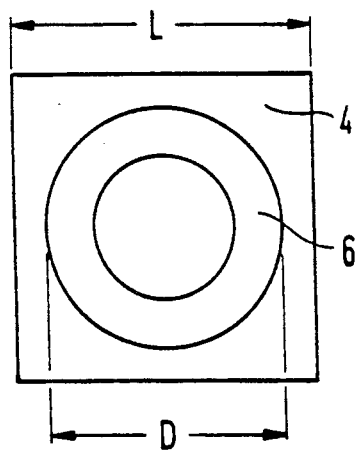
FIG. 2 illustrates a cross section through the measuring coil of the transformer disposed in the air gap according to the embodiment of FIG. 1.

In FIG. 2 the air gap 5 with emplaced measuring coil 6 is represented in cross section. It is evident that the exterior diameter D of the measuring coil 6 is smaller than the edge length L of the square core cross section in the air gap. Consequently, the measuring coil is dimensioned in such a way that it lies within the cross sectional area of the core and does not project outside beyond it at any point.

Figure 3:
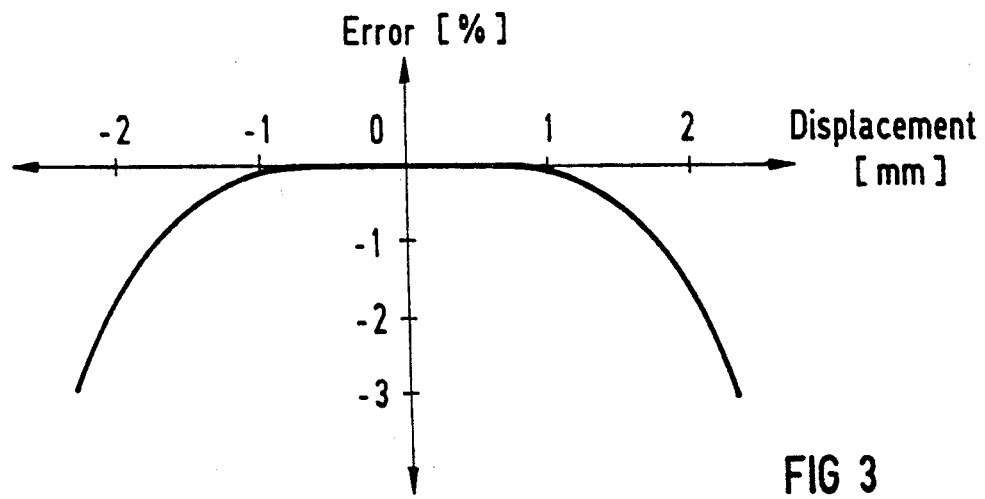
FIG. 3 illustrates an error curve for percentage measuring error as a function of the displacement of the measuring coil in the air gap.

The error diagram shown in FIG. 3, according to the scale of the cross sectional representation of FIG. 2 provides the percentage measuring error as a function of the displacement of the measuring coil 6 in the air gap 5. It is evident from the curve that the measuring error increases markedly only at the point where the measuring coil 6 begins to leave the homogeneous magnetic field of the core.

FIG. 4 illustrates the field line course of a magnetic field incident in the direction of the central axis of the measuring coil. Due to the bundling effect of the ferrite core 1, the field is concentrated in its primary yoke 2 because of the lesser magnetic resistance relative to the secondary yoke 4 in such a way that the magnetic parallel flow occurring in the secondary yoke 4 and consequently in the air gap 5 is negligibly small in comparison.

FIG. 5 illustrates the field line course of an external magnetic field acting upon the transformer perpendicularly to the coil axis. In this case the magnetic field lines are concentrated in the two shanks 7, 8 of the core and remain without effect on the air gap 5 and consequently the measuring coil 6.

FIG. 6 illustrates the coil form 9 of a non-magnetic material with the measuring coil 6 in cross section. FIG. 7 shows the coil form in top view. In both figures coil form 9 is formed of a frame-form holder with flexible fastening tabs 10 which are disposed and dimensioned so that they fix the coil form 6 in the introduced and adjusted state in the manner of a snap closure on the secondary yoke 4. The air gap itself and consequently also the height of the coil form are dimensioned so that the influence of a potential dc current premagnetization remains within the limits of tolerance of the measuring precision.

What is claimed is:

1. A current-voltage transformer for electronic house-service meters comprising:
   a winding having a current flowing in it to be measured by the electronic house-service meter;
   a ferromagnetic core having an air gap; and
   a measuring coil, magnetically coupled with said winding via said ferromagnetic core, wherein said measuring coil is inserted into the air gas with the coil axis in the direction of field lines, which arise in said air gap due to said current flowing in said winding, and is fastened, and dimensioned so that said measuring coil lies within the cross sectional area of the core, whereby said measuring coil measures a magnetic field in said air gap and thus said current flowing in said winding.

2. The current-voltage transformer of claim 1, wherein said ferromagnetic core is a ferrite core.

3. The current-voltage transformer of claim 2, wherein said core has a square cross section and a rectangular shape, having a primary yoke girded by the winding and a secondary yoke interrupted by the air gap and connected to said primary yoke via parallel shanks.

4. The current-voltage transformer of claim 3 further comprising a coil form of elastic synthetic material which is provided with elastic fastening tabs, said measuring coil being placed in said coil form which fix detachably the coil form disposed in the air gap to the core.

5. The current-voltage transformer of claim 2 further comprising a coil form of elastic synthetic material which is provided with elastic fastening tabs, said measuring coil being placed in said coil form, said fastening tabs fix detachably fixing the coil form disposed in the air gap to the core.

6. The current-voltage transformer of claim 1, wherein said core has a square cross section and a rectangular shape, having a primary yoke girded by the winding and a second yoke interrupted by the air gap and connected to said primary yoke via parallel shanks.

7. The current-voltage transformer of claim 6 further comprising a coil form of elastic synthetic material which is provided with elastic fastening tabs, said measuring coil being placed in said coil form and fastening tabs detachably fixing the coil form disposed in the air gap to the core.

8. The current-voltage transformer of claim 1 further comprising a coil form of elastic synthetic material which is provided with elastic fastening tabs, said measuring coil being placed in said coil form and said fastening tabs detachably fixing the coil form disposed in the air gap to the core.

* * * * *